(12) United States Patent
Young

(10) Patent No.: US 7,187,200 B2
(45) Date of Patent: Mar. 6, 2007

(54) COLUMNAR ARCHITECTURE

(75) Inventor: Steven P. Young, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 100 days.

(21) Appl. No.: 10/683,944

(22) Filed: Oct. 10, 2003

(65) Prior Publication Data

US 2005/0007155 A1   Jan. 13, 2005

Related U.S. Application Data

(63) Continuation-in-part of application No. 10/618,404, filed on Jul. 11, 2003, now Pat. No. 7,132,851.

(51) Int. Cl.
*H03K 19/177* (2006.01)

(52) U.S. Cl. .......................... 326/41; 326/47

(58) Field of Classification Search .............. 32/37–39, 32/41, 47, 101
See application file for complete search history.

(56) References Cited

U.S. PATENT DOCUMENTS

| | | | |
|---|---|---|---|
| 4,978,633 A * | 12/1990 | Seefeldt et al. ............. | 438/113 |
| 5,016,080 A | 5/1991 | Giannella et al. | |
| 5,068,603 A | 11/1991 | Mahoney et al. | |
| 5,341,049 A | 8/1994 | Shimizu et al. | |
| 5,773,854 A | 6/1998 | Pasch et al. | |
| 5,880,598 A | 3/1999 | Duong et al. | |
| 5,914,616 A | 6/1999 | Young et al. | |
| 6,204,689 B1 | 3/2001 | Percy et al. | |
| 6,255,848 B1 | 7/2001 | Schultz et al. | |
| 6,396,302 B2 | 5/2002 | New et al. | |
| 6,400,180 B2 | 6/2002 | Wittig et al. | |
| 6,487,708 B1 | 11/2002 | Canaris | |
| 6,538,470 B1 * | 3/2003 | Langhammer et al. ........ | 326/41 |
| 6,803,786 B1 * | 10/2004 | Bilski et al. .................. | 326/41 |

OTHER PUBLICATIONS

Xilinx, Inc.; DS083-2 (v2.7) Advance Product Specification; "Virtex-II Pro Platform FPGAs: Functional Description"; available from Xilinx, Inc., 2100 Logic Drive, San Jose, California 95124; pp. 1-48, Dec. 3, 2001.

Xilinx, Inc.; DS031-2 (v1.9) Advance Product Specification; "Virtex-II Platform FPGA Handbook," available from Xilinx, Inc., 2100 Logic Drive, San Jose, California 95124; Nov. 29, 2001, pp. 77-79.

* cited by examiner

*Primary Examiner*—James H. Cho
(74) *Attorney, Agent, or Firm*—LeRoy D. Maunu; Kim Kanzaki (57) ABSTRACT

An integrated circuit (IC) is disclosed having circuitry arranged in a plurality of columns. A column in the IC is essentially a series of aligned circuit elements of the same type that extends from a first edge of the IC to a second edge. In addition there may be a center column having circuit elements of different types.

15 Claims, 10 Drawing Sheets

COLUMNAR ARCHITECTURE

FIELD OF THE INVENTION

The present invention relates generally to integrated circuits and more specifically to an integrated circuit having circuit elements laid out in columns.

BACKGROUND INFORMATION

Programmable logic devices (PLDs), including field-programmable gate arrays (FPGAs), are integrated circuits (ICs) that can be programmed to implement user-defined logic functions. In a typical FPGA architecture, an array of configurable logic blocks (CLBs) and a programmable interconnect structure are surrounded by a ring of programmable input/output (I/O) circuit elements. Examples include the Virtex™ II Platform FPGA from Xilinx Inc. of San Jose Calif., and the Stratix™ device architecture from Altera Corp. of San Jose, Calif.

Figure 1:
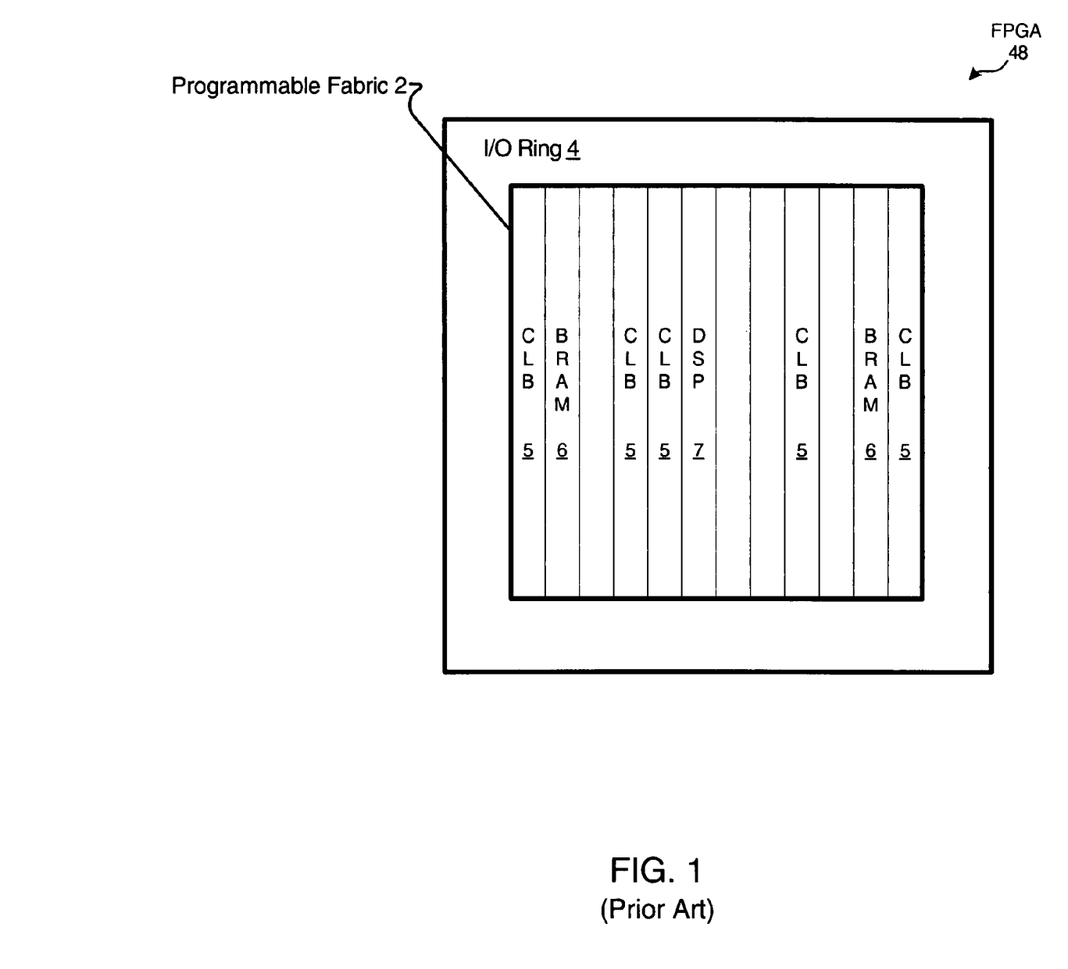
FIG. 1 is a simplified schematic view of a conventional FPGA.

FIG. 1 is a simplified schematic view of a conventional FPGA 48. The FPGA includes a programmable fabric 2 surrounded by an I/O ring 4. The programmable fabric 2 includes configurable logic block (CLB) columns 5, block random access memory (BRAM) columns 6, and a digital signal processing (DSP) column 7. The programmable fabric 2 further includes the programmable interconnect structure (not shown in FIG. 1) which allows the circuit elements or blocks in the programmable fabric to be interconnected with each other and with the circuit elements or blocks in the I/O ring. The I/O ring includes input and output circuit elements, for example, input/output blocks (IOBs)

As can be seen from FIG. 1 the I/O ring 4 is at the perimeter of the programmable fabric 2. Signals external to FPGA 48 can only communicate with the programmable fabric 2 via this perimeter I/O ring 4. There are a few disadvantages with this conventional arrangement. First, the total number of IOBs allowed is limited by, in effect, the circumference of the FPGA 48 rather than the area of the FPGA. Second, internal signals located in circuit elements near the center of the FPGA 48 must propagate to the perimeter via the programmable interconnect structure to exit the FPGA 48. Thus propagation delays are dependent upon distance of the circuit element to the perimeter. Third, manufacturing the FPGA 48 is complicated. The columns of mostly homogeneous circuit elements of the programmable fabric 2 must be fabricated and aligned with the circuit elements of I/O ring 4. The manufacturing problem is further exacerbated, as seen by FIG. 2 below, in that the I/O ring 4 has a few heterogeneous elements.

Figure 2:
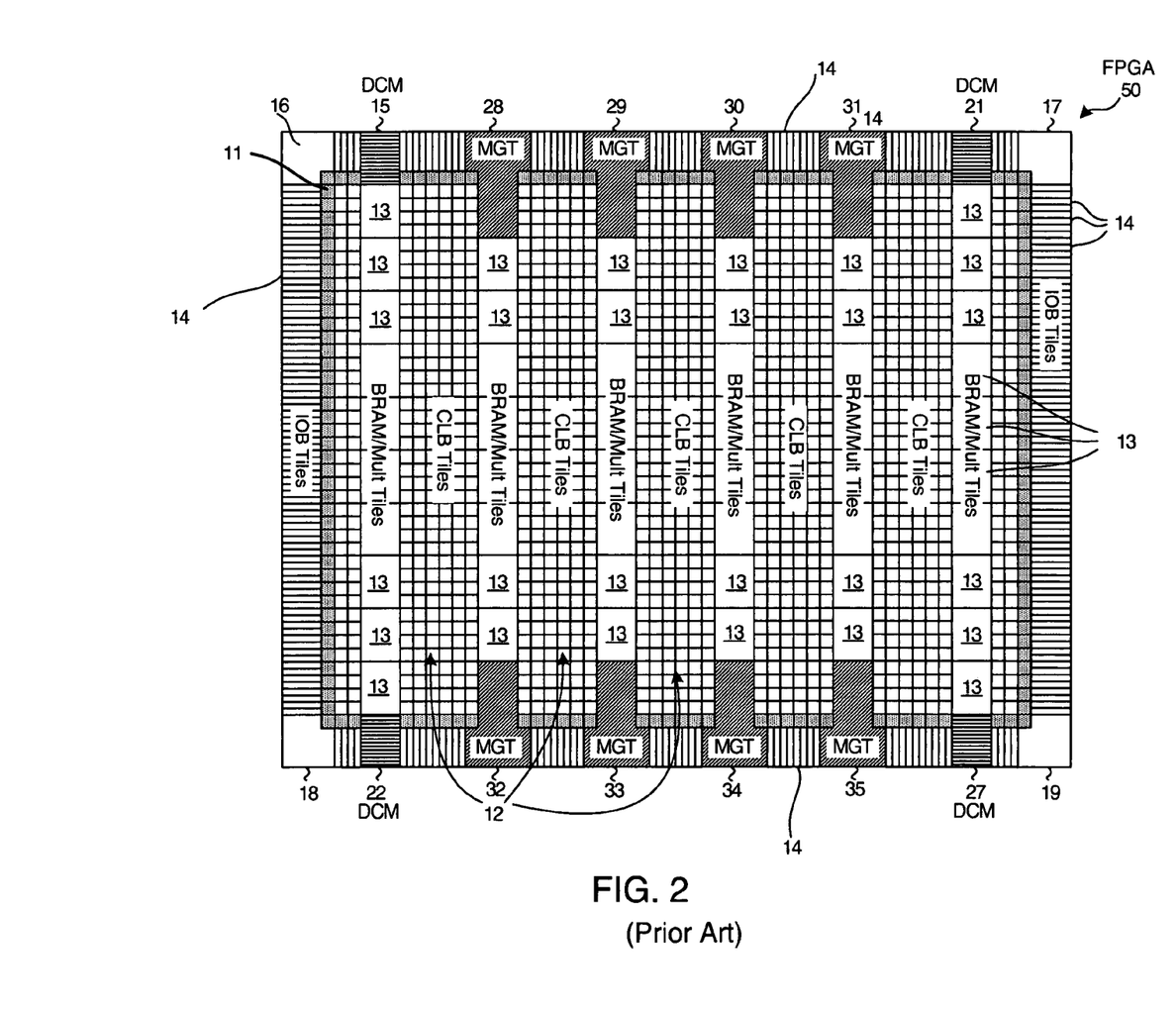
FIG. 2 is a more detailed diagram of another conventional FPGA having various CLB, IOB, and BRAM/multiplier tiles.

FIG. 2 is a more detailed diagram of another conventional FPGA having various CLB, IOB, and BRAM/multiplier tiles. The word "tile" is an area comprising a) circuitry with one or more programmable functions, including memory, or fixed non-programmable circuitry, and b) programmable interconnections. The CLB tiles 12 are laid out in a two-dimensional array. In this example, each CLB tile includes a portion of the configurable interconnect structure such that at least part of the interconnect structure for the FPGA 50 is formed by the various portions of the many CLBs when the CLB tiles are placed together on the FPGA. Also illustrated are block random memory/multiplier (BRAM/Mult) tiles 13.

In order to provide input/output circuitry for interfacing the FPGA 50 to external logic, IOB tiles 14 are provided along each of the four sides (top, bottom, left, right) of the FPGA. In this particular design, an input/output interconnect tile (IOI tile) is used to couple each pair of IOB tiles to a CLB tile. Reference numeral 11 points to one such IOI tile. IOI tile 11 is disposed between the two IOB tiles to its right and the CLB tile to its left.

In the example of FIG. 2, clock management (e.g., digital clock management or DCM) circuitry is fitted into the areas 15, 21, 22 and 27 above and below the leftmost and rightmost columns of BRAM/multiplier tiles. The other rightmost columns of BRAM/multiplier tiles have T-shaped multi-giga bit (MGT) transceiver tiles 28–35. The corner areas 16–19 of the FPGA 50 may be used to accommodate other miscellaneous circuitry. This miscellaneous circuitry may, for example, include configuration logic, encryption/decryption logic, global clock driver circuitry, a system performance monitor, and boundary scan circuitry.

For additional information on a tiled FPGA floorplan see U.S. Pat. No. 5,914,616 issued Jun. 22, 1999 by Young et. al. and U.S. Pat. No. 6,204,689 B1, issued Mar. 20, 2001, by Andrew K. Percy, et. al., both of which are incorporated by reference herein.

FIG. 2 has the same disadvantages listed for FIG. 1. In addition, modification of the layout of FIG. 2 is difficult. For example, addition of another column of BRAM/Mult tiles requires significant changes in both the programmable fabric as well as the I/O ring. Another example of a disadvantage, is that adding one or more DSP columns may require an entire new layout.

Thus there is need for techniques that minimize and/or eliminate the above-described disadvantages.

SUMMARY

The present invention includes a method and system for an integrated circuit (IC) that is arranged in a plurality of columns. In an exemplary embodiment of the present invention the IC does not have an I/O ring, but the I/O blocks (IOBs) are included in one or more IOB columns which make up one or more of the plurality of columns making up the IC. In this exemplary embodiment, for almost all of the columns, each homogeneous column has substantially aligned circuit elements of only one type. For example, except for a few clock or spacer tiles, a CLB column has substantially only CLB tiles. A BRAM column has substantially only BRAM tiles; a DSP column has substantially only DSP tiles; a IOB column has substantially only IOB tiles; a MGT column has substantially only MGT tiles; and so forth. In this embodiment, the homogeneous columns in the IC extend from a top edge of the IC to a bottom edge of the IC. In addition there my be a center column having heterogeneous typed elements, for example, a clock management element, a system monitor, configuration logic, and an IOB.

One embodiment of the present invention includes an integrated circuit (IC), including circuitry arranged in an array having a plurality of rows and a plurality of columns. Each row begins at a first side of the IC and ends at a second side of the IC, and each column begins at a third side of the IC and ends at a fourth side of the IC. The IC includes: a column having two or more circuit elements of the same circuit type substantially occupying the column; and a row positioned at the third side of the IC, wherein the number of circuit elements of an input and output circuit type, e.g., Input/Output Blocks and Multi-Giga Bit Transceiver circuits or Input/Output Blocks alone, in the row is less than the number of remaining circuit elements of the other circuit types in the row.

Another embodiment of the present invention includes an integrated circuit (IC) having circuitry with programmable functions and programmable interconnects. The IC further includes a plurality of homogeneous columns. Each of the homogeneous columns starts at one side of the IC and ends at an opposite side of the IC. And a homogeneous column includes a set of substantially identical circuit elements of the same circuit type substantially filling the column. The circuit type may be selected from a group consisting of a Configurable Logic Block (CLB) type, a Multi-Giga Bit Transceiver (MGT) type, a Block Random Access Memory (BRAM) type, a fixed logic type, an Input/Output Interconnect (IOI) circuit type, and an Input/Output Block (IOB) type, wherein the fixed logic type comprises a Digital Signal Processor (DSP) circuit type, a multiplier circuit type, an arithmetic circuit type, and an application specific circuit type.

Yet another embodiment of the present invention includes a method for generating a circuit layout of an integrated circuit (IC). The method starts with obtaining a plurality of column types, wherein each column type of the plurality of column types represents one or more columns in the IC. Each column is substantially occupied by circuit elements of a circuit type and the one or more columns extend from a side of the IC to an opposite side of the IC. Next, at least one column type from the plurality of column types is selected. And lastly, the circuit layout of the IC is formed, at least in part, by using a column associated with the at least one column type.

Other structures and methods are described in the detailed description below. This summary does not purport to define the invention. The invention is defined by the claims.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention.

This patent application is a continuation-in-part of U.S. patent application Ser. No. 10/618,404, titled "Columnar Floorplan", by Steven P. Young filed Jul. 11, 2003, which is herein incorporated by reference in its entirety.

In general the columnar architecture represents a form of modular design. Each module, for example, each column, belongs to a module type, for example, a column type. By looking at an application field for the integrated circuit, different module types and various numbers of modules in each module type may be selected. For example column types may include a digital signal processing (DSP) column type having DSP circuit elements, a configurable logic block (CLB) column type having CLB circuit elements, a memory column type having memory circuit elements, and input/output column type having IOB circuit elements. For an application field, such as communications, which may need a lot of digital signal processing, a first IC may include many columns from the DSP column type. For a network switching application field there may be many columns from the CLB and memory column types in this second IC. Thus various module types and various numbers of modules of each module type, i.e., families of modules, can be selected in order to produce different columnar architectures based on the application area of use.

Figure 3:
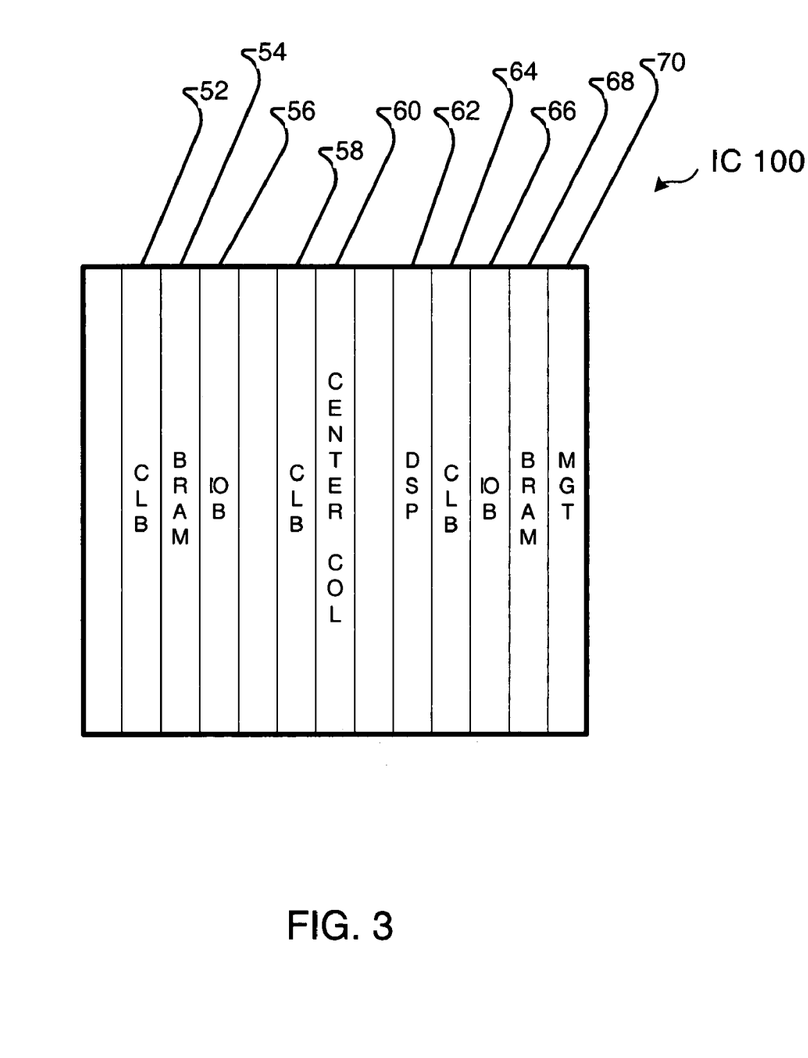
FIG. 3 is a simplified diagram of an IC in accordance with one embodiment of the present invention.

In an exemplary embodiment of the present invention the I/O ring 4 described in FIG. 1 is absent in the columnar architecture. The rows having many IOB tiles at the top side and bottom side of the FPGA 50 of FIG. 2, have been removed and IOB tiles are arranged exclusively in columns (see FIGS. 3 and 4). The IOB tiles are no longer required to be on the edge of the IC because of well-known flip-chip technology. In addition other circuit elements such as digital clock management (DCM) circuits, and configuration logic (not shown, but located in the four corners 16–19) have been relocated to a center column (FIG. 3). Hence this exemplary embodiment includes a plurality of homogeneous columns, where each homogeneous column has substantially identical circuit elements of the same circuit type that substantially fills the homogeneous column, and a heterogeneous center column located at about a center axis of the IC.

FIG. 3 is a simplified diagram of an IC 100 in accordance with one embodiment of the present invention. The IC includes two or more homogeneous columns, wherein each of the homogeneous columns starts at one side of the IC and ends at an opposite side of the IC. Each homogeneous column has substantially identical circuit elements substantially filling the column. The substantially identical circuit elements in a column are of a particular circuit type from a group of circuit types that includes a Configurable Logic Block (CLB) type, a Multi-Giga Bit Transceiver (MGT) type, a Block Random Access Memory (BRAM) type, a Digital Signal Processor (DSP) type, a multiplier circuit type, an arithmetic circuit type, an Input/Output Interconnect (IOI) circuit type, an Input/Output Block (IOB) type, and an application specific circuit type. For example, a Configurable Logic Block (CLB) circuit type, has identical circuit elements, in this example, CLB tiles, substantially filling the column (i.e., except for maybe, for example, a few spacer and clock tiles, substantially all of the layout area in the column is occupied by aligned CLB tiles). This homogeneous column substantially filled with CLB tiles is also referred to as a column having a CLB column type. The same also applies to a homogeneous column substantially filled with circuit elements of the MGT type, i.e., MGT tiles (also referred to as a MGT column type), a homogeneous column substantially filled with circuit elements of the BRAM type, i.e., BRAM tiles (also referred to as a BRAM column type), a homogeneous column substantially filled with circuit elements of the DSP type, i.e., DSP tiles (also referred to as a DSP column type), a homogeneous column substantially filled with circuit elements of IOB type, i.e., IOB tiles (also referred to as a IOB column type), a homogeneous column substantially filled with circuit elements of the IOI type, i.e., IOI tiles (also referred to as a IOI column type), a homogeneous column substantially filled with circuit elements of the multiplier type, i.e., multiplier tiles (also referred to as a multiplier column type), a homogeneous column substantially filled with circuit elements of the fixed logic type, i.e., fixed logic tiles (also referred to as a fixed logic column type), a homogeneous column substantially filled with circuit elements of the application specific circuit type, i.e., application specific circuit tiles (also referred to as a application specific circuit column type), and so forth. Examples of some of the circuit elements and circuit types may be found in the Virtex™-II Platform FPGA Handbook by Xilinx Inc. of San Jose Calif. (Dec. 3, 2001).

IC 100 includes homogeneous columns 52, 58, and 64 of a CLB column type, homogeneous columns 54 and 68 of a BRAM column type, homogeneous columns 56 and 66 of a IOB column type, homogeneous column 62 of a DSP column type, and homogeneous column 70 of a MGT column type. Optionally, there is a heterogeneous column 60 (center col.) that may have circuit elements of different circuit types. While the circuitry of the IC 100 may include circuits having programmable functions coupled together by programmable interconnects, the scope of the present invention is not so limited, but includes any IC having a plurality of homogeneous columns of a plurality of column types, where each column type is a column that is substantially filled with circuit elements of the same type. Thus, while an FPGA may be described in certain embodiments, this is for illustration purposes, and the present invention is not limited in scope to FPGAs.

Figure 4:
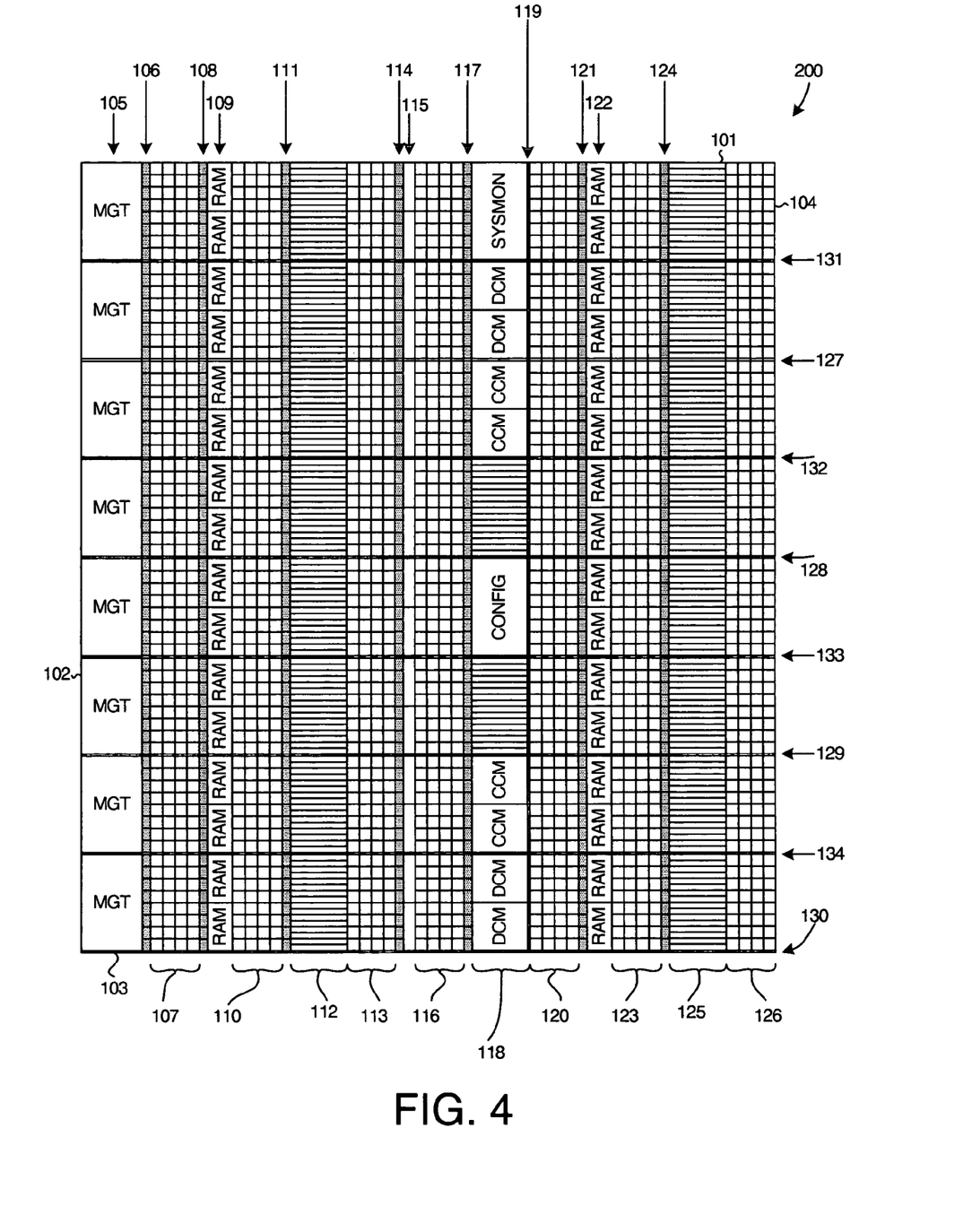
FIG. 4 is a simplified diagram of an FPGA in accordance with another embodiment of the present invention.

FIG. 4 is a simplified diagram of an FPGA 200 in accordance with another embodiment of the present invention. FPGA 200 is a rectangular die and has four sides 101-104. The circuitry of the FPGA 200 is laid out across the surface of a die as a plurality of columns of repeatable tiles. Proceeding from the left side 102 of FPGA 200 to the right side 104 of FPGA 200, there is a column of multi-gigabit transceiver (MGT) tiles 105, a column of input/output interconnect (IOI) tiles 106, four columns of configurable logic block (CLB) tiles 107, a column of IOI tiles 108, a column of block random access memory (BRAM) tiles 109, four columns of CLB tiles 110, a column of IOI tiles 111, a column of input/output block (IOB) tiles 112, four columns of CLB tiles 113, a column of IOI tiles 114, a column of digital signal processing (DSP) tiles 115, four columns of CLB tiles 116, a column of IOI tiles 117, a heterogeneous column 118 made up of multiple different types of tiles (i.e., the center column), a column of clock distribution tiles 119, four columns of CLB tiles 120, a column of IOI tiles 121, a column of BRAM tiles 122, four columns of CLB tiles 123, a column of IOI tiles 124, a column of IOB tiles 125, and four columns of CLB tiles 126.

Note that the area of each of the homogeneous columns of tiles, (excluding the center heterogeneous column 118) is occupied primarily by a single type of tile. There are also horizontally extending narrow clock distribution and configuration distribution tiles and horizontally extending narrow spacer tiles. The clock distribution tiles within each column line up with the clock distribution tiles in each of the other columns such that a horizontally extending clock distribution structure is formed that extends all the way across the FPGA 200 from left side 102 to right side 104. The horizontally extending clock distribution structures are indicated in FIG. 4 with reference numerals 131-134. In the same way that the clock distribution tiles of the various columns line up to form structures that extend all the way across the FPGA 200 in the horizontal dimension, so too do the spacer tiles of the various columns line up. In the example of FIG. 4, the spacer tiles line up to form horizontally extending spacer structures 127–130.

The center column 118 of the FPGA 200 of FIG. 4 has the circuit elements that were mostly distributed in the corners of the I/O ring in FIG. 2. The circuit elements in column 118 include, for example, a System performance monitor (SYSMON) circuit, a digital clock manager (DCM) circuit, a clock companion module (CCM) circuit, and configuration logic (CONFIG). The System performance monitor may include an analog-to-digital converter (ADC) to monitor parameters like temperature and voltage both on-chip and off-chip. The DCM may include circuits to perform clock de-skew, clock phase shifting, clock frequency synthesis, and other clock features. The CCM may include circuits for phase-matched binary clock division and internal clock jitter & skew measurement. The configuration logic includes logic needed to address and load the configuration memory cells of the SRAM-based FPGA during configuration of the FPGA. The configuration logic in this example also includes configuration registers, boundary scan test circuitry such as JTAG circuitry, and encryption and/or decryption circuitry used to encrypt and/or decrypt bitstreams of configuration data loaded into and read out of the FPGA. This configuration logic is centralized in one location. This avoids the inefficiency and effort of partitioning the configuration logic into the four corners of the die. It also allows internally generated configuration signals to reach the entire die faster because these signals are starting from a central location.

Like FIG. 3, the FPGA die 200 of FIG. 4 does not have IOB tiles disposed all along the top side 101 and the bottom side 103 of the die as is done in conventional FPGAs (see FIG. 2). Because the tiles of a particular column are substantially of the same type (e.g., but for the incidental and relatively small clock distribution tiles and spacer tiles), the width of the type of tile in the column can be set to provide the amount of die area needed for the circuitry of the tile. The result is an efficient use of die area. In the embodiment of FIG. 4, there can be more than two columns of IOB tiles. In addition, extra IOB tiles can be disposed in the central column 118 along with the other circuit types of tiles.

Figure 5:
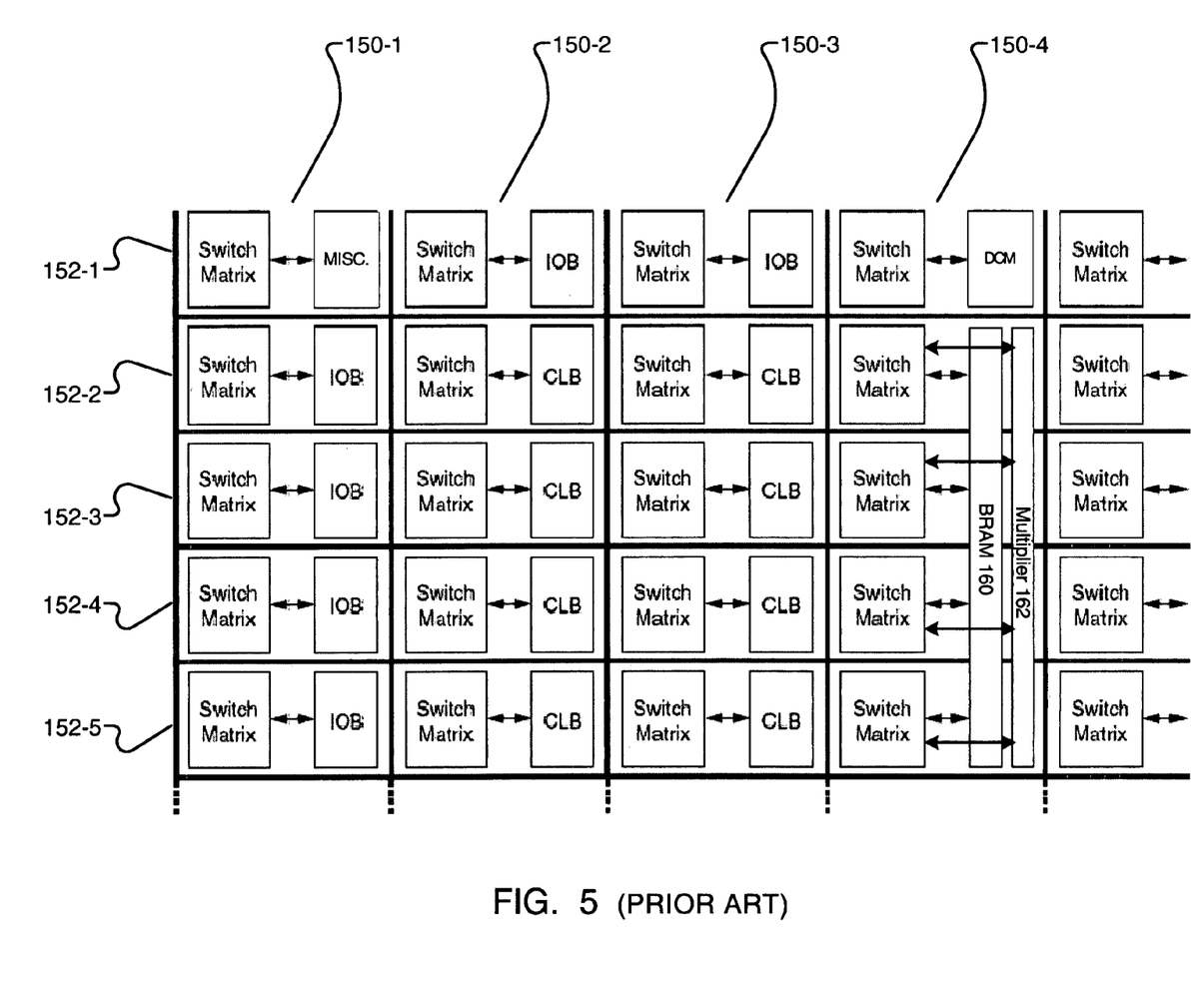
FIG. 5 is a simplified schematic of part of an array of tiles in a prior art FGPG.

FIG. 5 illustrates a simplified schematic of part of an array of tiles in a prior art FPGA (see the Virtex™ II Platform FPGA from Xilinx Inc. Of San Jose Calif, Nov. 29, 2001 pages 77–79). The array of tiles in FIG. 5 has columns 150-1 to 150-4 and rows 152-1 to 152-5. A tile comprises generally, in FIG. 5 a functional element such as an IOB, CLB, or DCM connected to a switch matrix, where the switch matrix connects to the global routing resources of the FPGA. Column 150-4 has a variation on this general description of a tile in that the BRAM 160 and Multiplier 162 are the functional elements which span four tiles and are connected to four switch matrices (one in each tile). The I/O ring includes the IOB tiles in the first row 152-1 and first column 150-1 and the MISC. tile having part of the miscellaneous circuitry as given in corner regions 16-19 of FIG. 2. In one embodiment of the present invention, the basic structure of the tiles remains the same, but the arrangement changes, so that for most to almost all of the columns, each column has the same type of tiles, e.g., CLB tiles, IOB tiles, BRAM/ Mult tiles, DSP tiles. Hence, for example, in the embodiment shown in FIG. 3 the DSP column 62 may include DSP tiles, where each DSP tile has a digital signal processing circuit element as its functional element connected to a switch matrix. Other types of functional elements may include graphics processing elements, multi-media processing elements, audio and/or video processing elements, communication processing elements, real-time control processing elements, fixed logic elements, non-volatile memory elements, and application specific processing elements.

Figure 6:
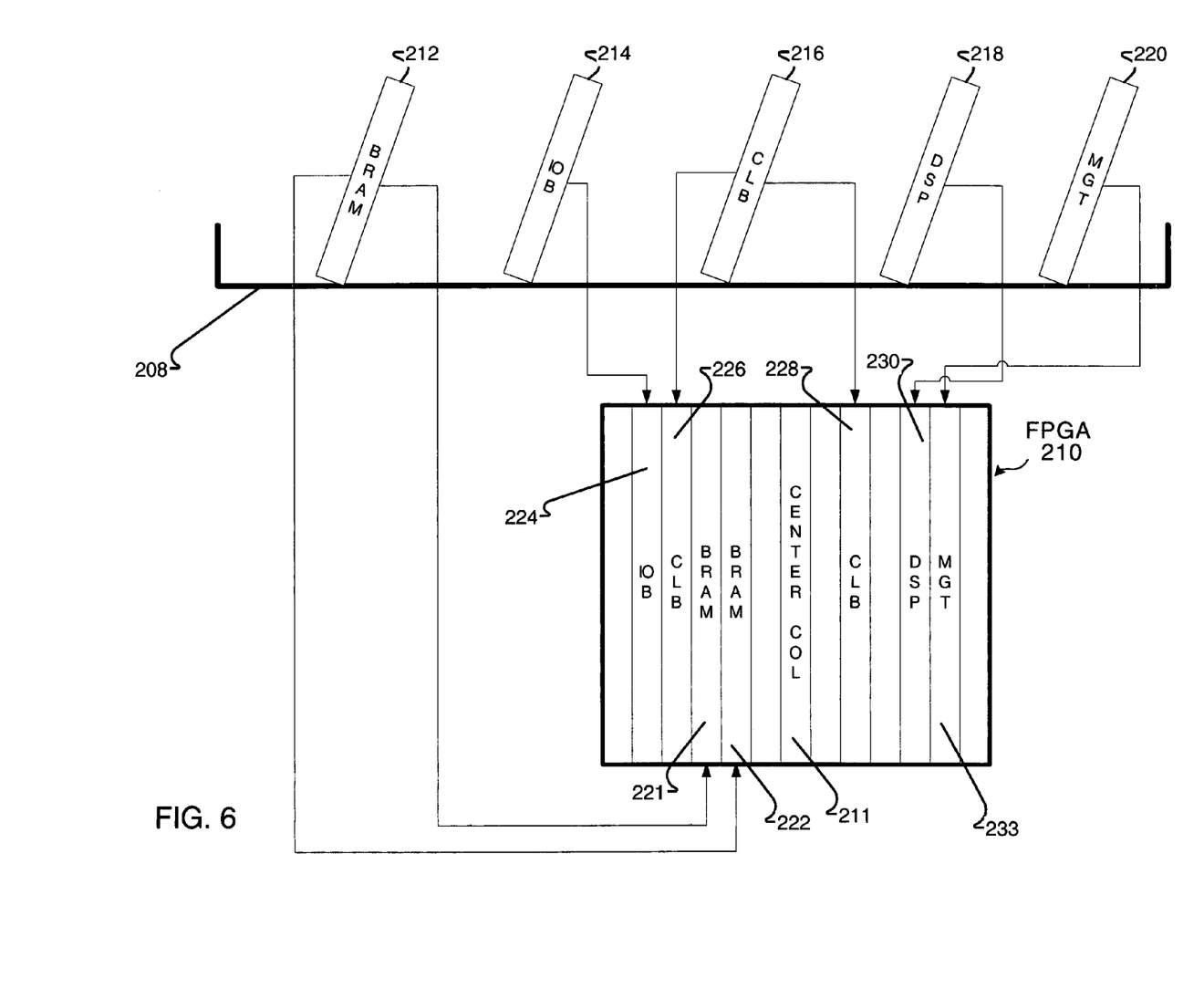
FIG. 6 is a diagram illustrating the method of forming an IC layout from combining columns from various column types of an embodiment of the present invention.

FIG. 6 is a diagram illustrating a method of forming an IC layout from combining columns from various column types of an embodiment of the present invention. FPGA 210 includes a center column 211 and one or more columns, e.g., IOB column 224, CLB column 226, BRAM column 221, BRAM column 222, CLB column 228, DSP column 230, and MGT column 233, selected from a library 208 of column types, e.g., BRAM column type 212, IOB column type 214, CLB column type 216, DSP column type 216, and MGT column type 220. Each column type includes a circuit layout for that column. Each column of a particular column type has substantially identical circuit elements or tiles for the associated circuit type.

Thus a method, for generating a circuit layout of an integrated circuit (IC) such as an FPGA 120 includes obtaining a plurality of column types in a library which may be part of a database. Next, using a computer system, several column types and column layouts from the column types are selected based on an application area of use. Using a known circuit layout tool, the selected column layouts can be used to form, at least in part, the circuit layout of the IC.

Referring to FIG. 6, BRAM column type 212, IOB column type 214, CLB column type 216, DSP column type 216, and MGT column type 220 have been selected from a larger set of column types (the larger set may include, for example, a controller column type having controller circuit elements, a graphics column type having graphics circuit, an audio or video column type having audio or video circuit elements, a wireless column type having wireless communication elements, a switching column type having switching elements, a real-time column type having real-time elements, and the like). IOB column 224 is formed on FPGA 210 with the circuit layout associated with IOB column type 214. CLB columns 226 and 228 are formed on FPGA 210 with the circuit layout associated with CLB column type 216. BRAM columns 221 and 222 are formed on FPGA 210 with the circuit layout associated with BRAM column type 212. DSP column 230 is formed on FPGA 210 with the circuit layout associated with DSP column type 218. And MGT column 233 is formed on FPGA 210 with the circuit layout associated with MGT column type 220.

Figure 7:
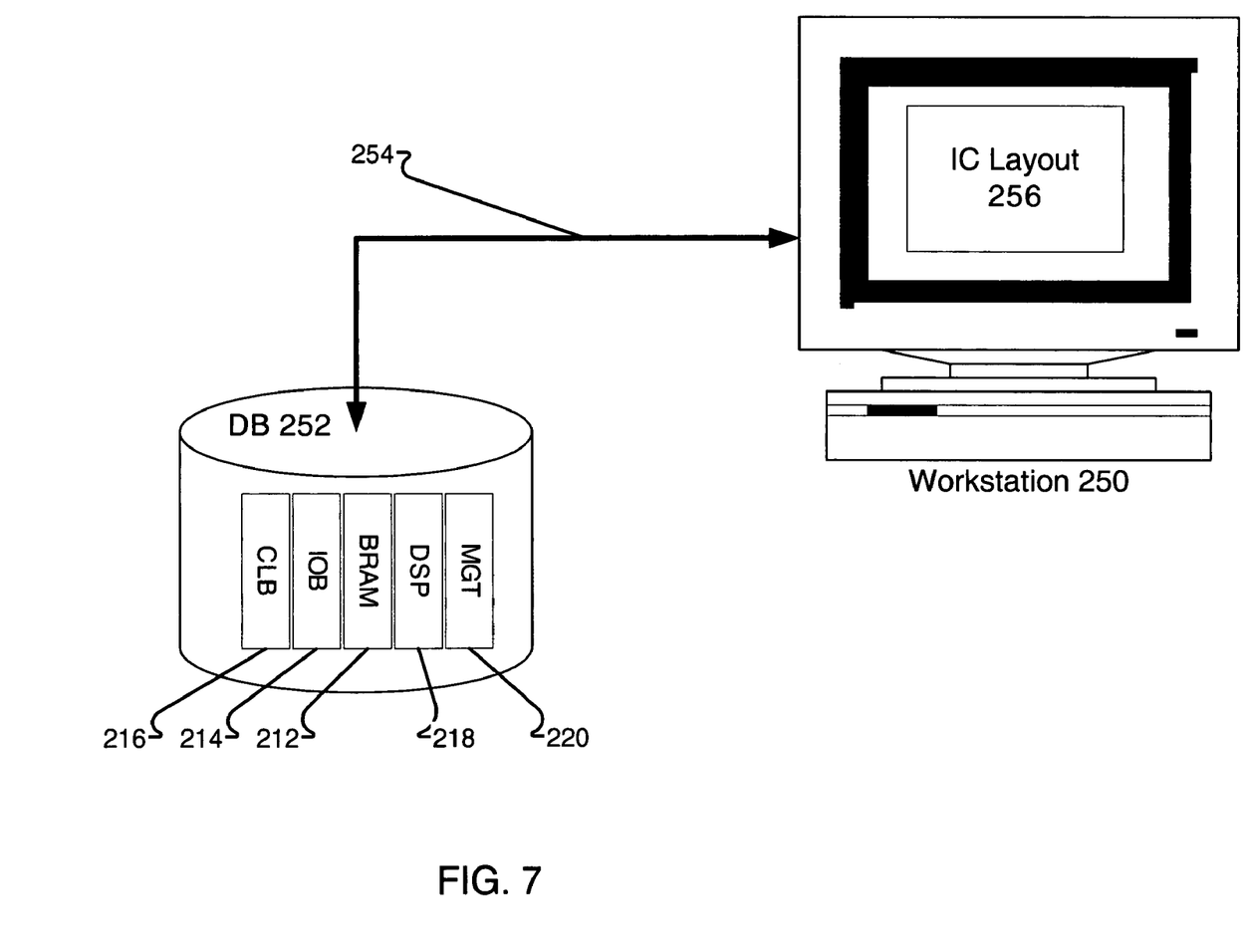
FIG. 7 is a diagram of a system for generating the circuit layout of the FPGA shown in FIG. 6.

FIG. 6 is a diagram of a system for generating the circuit layout of FPGA 210 shown in FIG. 6. A database 252 stores the circuit layouts of the column types such as the BRAM column type 212, IOB column type 214, CLB column type 216, DSP column type 216, and MGT column type 220. The database 252 is connected via communications network 254 to a computer workstation 250. The computer workstation 250 runs a conventional circuit design and layout tool, which includes the IC layout 256 for FPGA 210.

By selecting or dialing-in columns of different column types, numerous families of FGPAs may be created. For example, an application area which uses mostly logic may have many columns of CLBs, an application area which uses a lot of digital signal processing may have many columns of DSPs, and an application area which uses an embedded microprocessor may have columns selected to enhance microprocessor use, such as MGT columns.

Figure 8:
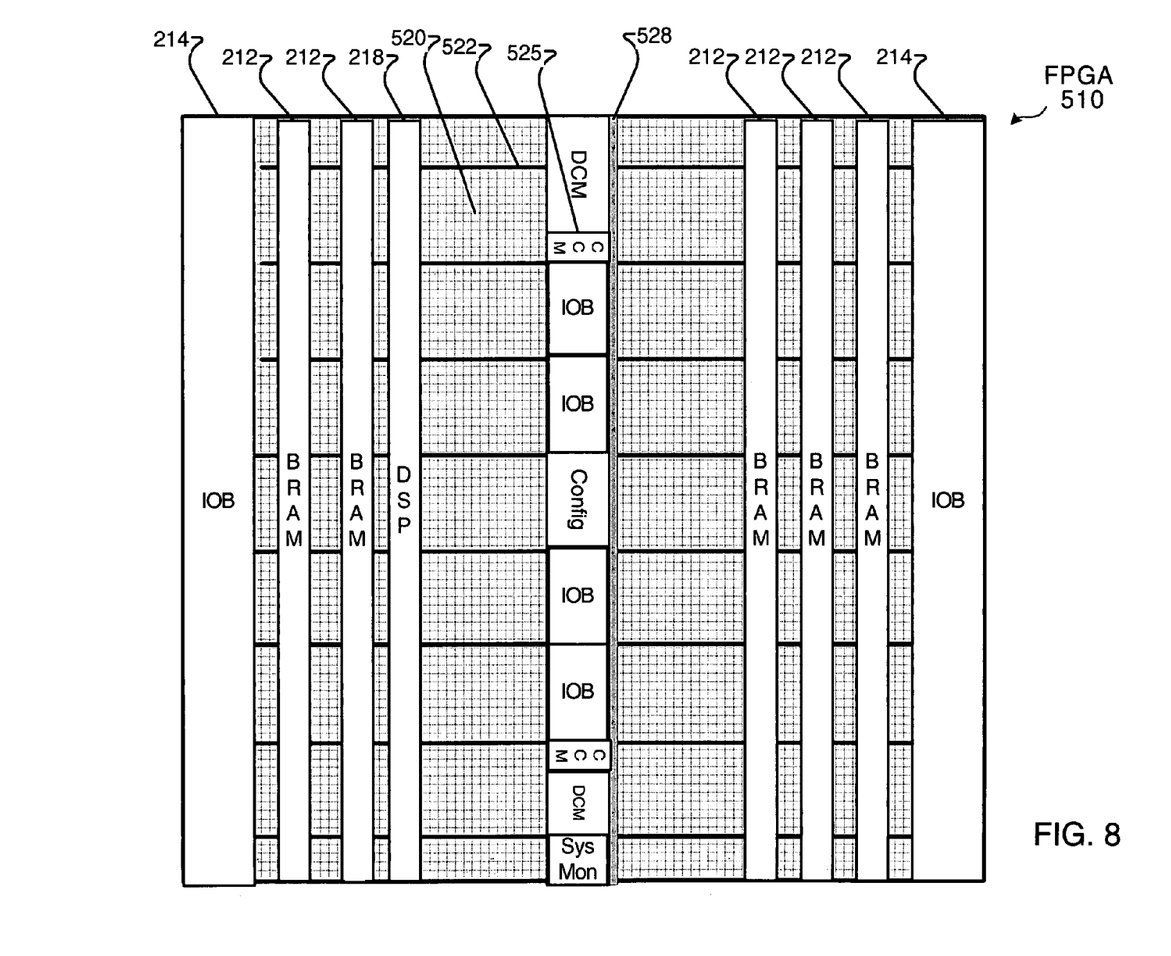
FIGS. 8, 9, and 10, are examples of three different families of FPGAs.
Figure 9:
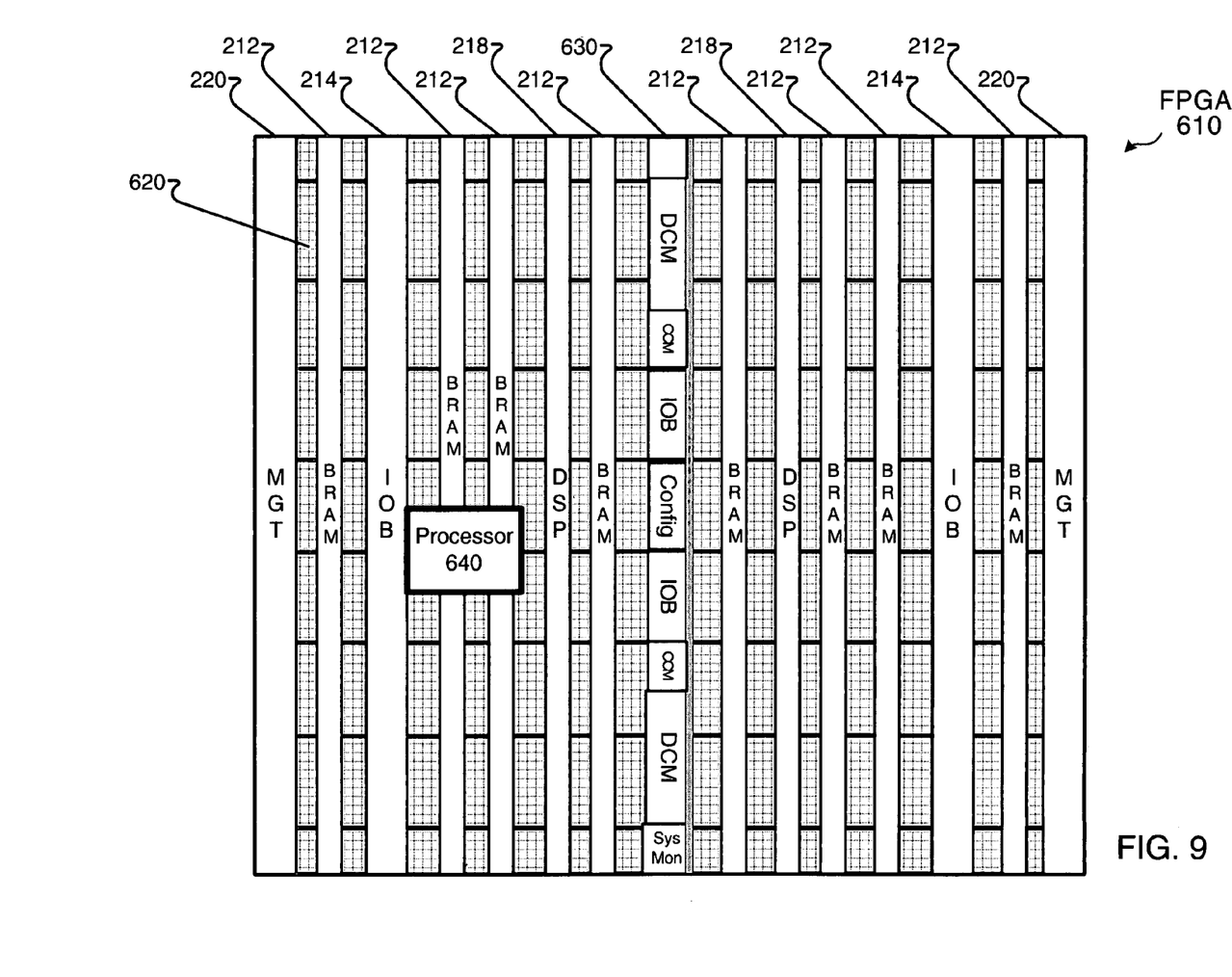
Figure 10:
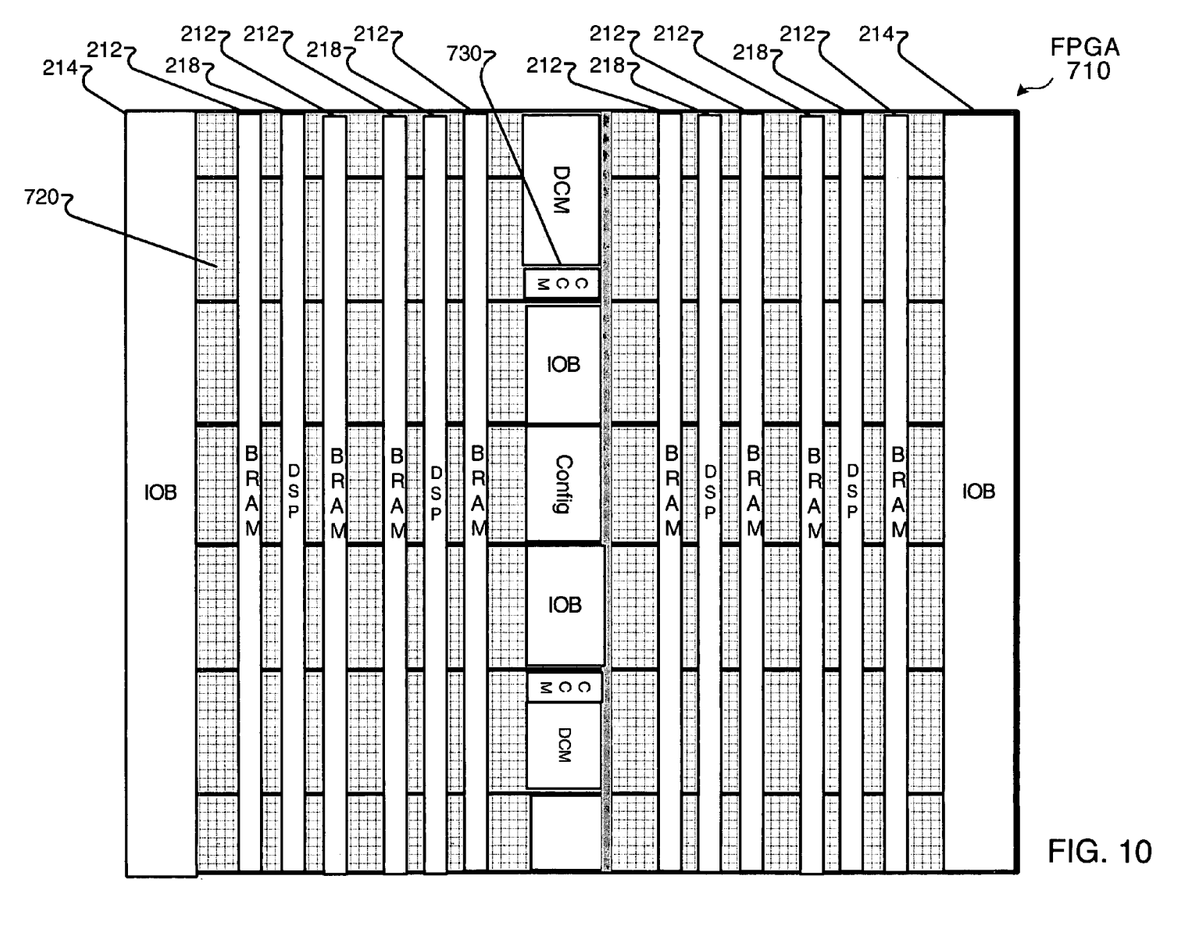

FIGS. 8, 9, and 10, are examples of three different families of FPGAs that may be created using different mixes of column types and number of columns from each column type. For ease of understanding the columns of the same column type are labeled with their column type.

FIG. 8 may have a similar application area of use as FPGA 48 in FIG. 1. The CLBs are shown by grayed crossed area 520. Horizontal line 522 may include clock or spacer tiles. Center column 525 has circuit elements the same as or similar to column 118 of FIG. 4. Also shown is a clock column 528 with clock tiles. FPGA 510 is logic intensive with IOBs on the FPGA sides (IOB column type 214) and in the center column 525.

FIG. 9 is an example of an FPGA 610 having an embedded processor (e.g., IBM PowerPC™) 640. The CLBs are shown by grayed crossed area 620. Center column 630 has circuit elements similar or the same as to column 118 of FIG. 4. In order to facilitate high data rate I/O, two columns of the MGT column type 220 have been added. While FIG. 9 shows one embedded processor, there may be multiple embedded processors.

FIG. 9 having an FPGA with one or more embedded processors is still a columnar architecture and an embodiment of the present invention. The processor 640 is rectangular in shape and breaks-up the several BRAM columns 212 and CLB columns (grayed crossed area), however, the remainder of FPGA 610 still has many homogeneous columns. As there is a need for only a relatively few PowerPC™ processors from IBM Inc., these few relatively large circuits are not placed in a column, but have a layout similar to the Virtex-II PRO™ FPGA from Xilinx Inc. of San Jose, Calif. Thus the advantages of having an FPGA made up mostly of homogeneous columns is substantially maintained with the additional major advantage of having an embedded processor(s). In another embodiment any large application specific integrated circuit used in conjunction with the homogeneous columns can replace the embedded processor(s), for example, a digital signal processor(s) or a graphics processor(s).

FIG. 10 is an example of an FPGA 610 having an application area of use that needs a lot of digital signal processing. Hence there are four DSP columns 218. The CLBs are shown by grayed crossed area 720. Center column 730 has circuit elements the same as or similar to column 118 of FIG. 4.

Accordingly, various modifications, adaptations, and combinations of various features of the described embodiments can be practiced without departing from the scope of the invention as set forth in the following claims.

What is claimed is:

1. An integrated circuit (IC) comprising circuitry having programmable functions and programmable interconnects, the IC further comprising:
   a plurality of homogeneous columns and
   wherein each of the homogeneous columns starts at one side of the IC and ends at an opposite side of the IC, and
   wherein a first column of the plurality of homogeneous columns comprises a first set of substantially identical circuit elements of a first circuit type substantially filling the first column;
   a heterogeneous column having configuration logic and a clock management circuit element;
   wherein a second column of the plurality of homogeneous columns comprises a second set of substantially identical circuit elements of a second circuit type substantially filling the second column,
   a third column of the plurality of homogeneous columns comprises a third set of substantially identical circuit elements of a third circuit type substantially filling the third column,
   the first, second, and third circuit types are different from one another,
   at least one of the first, second, and third circuit types is an Input/Output Block (IOB) type, and each circuit element of an IOB type provides a circuit interface to circuitry external to the integrated circuit, and a column of IOB type circuit elements is between two columns that are not columns having IOB type circuit elements.

2. The integrated circuit of claim 1 wherein the heterogeneous center column further comprises an input/output block.

3. The integrated circuit of claim 1 wherein the first circuit type is selected from a group consisting of a Configurable Logic Block (CLB) type, a Multi-Giga Bit Transceiver (MGT) type, a Block Random Access Memory (BRAM) type, a fixed logic type, an Input/Output Interconnect (IOI) circuit type.

4. The integrated circuit of claim 3 wherein the fixed logic type comprises a Digital Signal Processor (DSP) circuit type, a multiplier circuit type, an arithmetic circuit type, and an application specific circuit type.

5. The integrated circuit (IC) of claim 1 wherein the integrated circuit further comprises a field programmable gate array (FPGA).

6. The integrated circuit (IC) of claim 1 wherein the integrated circuit further comprises a programmable logic device (PLD).

7. The integrated circuit of claim 1, wherein the clock management circuit element in the heterogeneous column performs clock de-skew, clock phase shifting, and clock frequency synthesis.

8. The integrated circuit of claim 7, wherein the configuration logic in the heterogeneous column performs addressing and loading of configuration memory cells for the programmable functions and programmable interconnects of the IC.

9. An integrated circuit (IC) comprising:

a heterogeneous center column having configuration logic and a clock management circuit element;

a plurality of columns and wherein each of the columns starts at one side of the IC and ends at an opposite side of the IC, wherein a first column of the plurality of columns comprises a first set of substantially identical circuit elements of a first circuit type substantially filling the first column, wherein a second column of the plurality of columns comprises a second set of substantially identical circuit elements of a second circuit type substantially filling the second column; and wherein the first and second circuit types are different from one another, at least one of the first and second circuit types is an Input/Output Block (IOB) type, and each circuit element of an IOB type provides a circuit interface to circuitry external to the integrated circuit, and a column of IOB type circuit elements is between two columns that are not columns having IOB type circuit elements.

10. The integrated circuit of claim 9 further comprising circuitry having programmable functions and programmable interconnects.

11. The integrated circuit of claim 10 wherein at least one of the first and second circuit types is a circuit type selected from a group consisting of a Configurable Logic Block (CLB) type, a Multi-Giga Bit Transceiver (MGT) type, a Block Random Access Memory (BRAM) type, a Digital Signal Processor (DSP) circuit type, a multiplier circuit type, an arithmetic circuit type, an Input/Output Interconnect (IOI) circuit type, and an application specific circuit type.

12. The integrated circuit of claim 9 wherein the substantially identical circuit elements are substantially identical tiles.

13. The integrated circuit of claim 12 wherein each tile comprises a functional element coupled to a switch matrix.

14. The integrated circuit of claim 9, wherein the clock management circuit element in the heterogeneous center column performs clock de-skew, clock phase shifting, and clock frequency synthesis.

15. The integrated circuit of claim 14, wherein the configuration logic in the heterogeneous center column performs addressing and loading of configuration memory cells in the IC.

* * * * *